(12) United States Patent
Wang et al.

(10) Patent No.: US 12,069,848 B2
(45) Date of Patent: Aug. 20, 2024

(54) SENSE LINE AND CELL CONTACT FOR SEMICONDUCTOR DEVICES

(71) Applicant: Micron Technology, Inc., Boise, ID (US)

(72) Inventors: Kuo-Chen Wang, Hiroshima (JP);
Terrence B. McDaniel, Boise, ID (US);
Russell A. Benson, Boise, ID (US);
Vinay Nair, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 121 days.

(21) Appl. No.: 17/729,450

(22) Filed: Apr. 26, 2022

(65) Prior Publication Data

US 2023/0345708 A1 Oct. 26, 2023

(51) Int. Cl.
*H10B 12/00* (2023.01)

(52) U.S. Cl.
CPC ......... *H10B 12/482* (2023.02); *H10B 12/485* (2023.02); *H10B 12/50* (2023.02)

(58) Field of Classification Search
CPC ...... H10B 12/482; H10B 12/50; H01L 12/485
USPC .................................................. 257/906, 908
See application file for complete search history.

(56) References Cited

U.S. PATENT DOCUMENTS

| | | |
|---|---|---|
| 10,607,995 B2 | 3/2020 | Roberts et al. |
| 2018/0323200 A1 | 11/2018 | Tang et al. |
| 2019/0067278 A1* | 2/2019 | Seo ..................... H01L 29/0649 |
| 2019/0103406 A1 | 4/2019 | Tang et al. |
| 2019/0164985 A1 | 5/2019 | Lee et al. |
| 2021/0013226 A1 | 1/2021 | Tang et al. |

OTHER PUBLICATIONS

U.S. Appl. No. 16/204,224, entitled, "Memory Arrays," filed Nov. 29, 2018, 43 pages.

* cited by examiner

*Primary Examiner* — Hoai V Pham
(74) *Attorney, Agent, or Firm* — Brooks, Cameron & Huebsch, PLLC (57) ABSTRACT

Methods, apparatuses, and systems related to a sense line and cell contact for a semiconductor structure are described. An example apparatus includes a first source/drain region and a second source/drain region, where the first source/drain region and the second source/drain region are separated by a channel, a gate opposing the channel, a sense line material coupled to the first source/drain region by a cell contact, where the cell contact is made from a combination of a first polysilicon material and a second polysilicon material, and a storage node coupled to the second source/drain region.

19 Claims, 12 Drawing Sheets

SENSE LINE AND CELL CONTACT FOR SEMICONDUCTOR DEVICES

TECHNICAL FIELD

The present disclosure relates generally to semiconductor devices and methods, and more particularly to a sense line and cell contact.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

As design rules scale to smaller dimensions, difficulties with fabrication and/or processing defects can arise. For instance, in one example process an opening may be formed through one or more layers of materials to receive subsequent processing steps to form one or more discrete components such as cell contact (e.g., coupled to a sense line). However, etching to form such an opening at smaller dimensions may result in necking (e.g., creating a distortion at an interface between two materials), and/or another processing defect, such as bending or tapering.

Such processing defects (e.g., tapering, necking and/or bending) if not reduced (e.g., removed), may contribute to unintended consequences related to the electrical properties of a semiconductor structure (e.g., memory device), which may adversely affect performance related to data access, storage, and/or processing functions of the semiconductor structure.

The present disclosure includes methods, apparatuses, and systems related to reduction of processing defects (e.g., tapering, necking and/or bending) associated with a sense line and cell contact. An example of an apparatus described herein includes a first source/drain region and a second source/drain region, where the first source/drain region and the second source/drain region are separated by a channel, a gate opposing the channel, a sense line coupled to the first source/drain region by a cell contact, where the cell contact is made from a combination of a first polysilicon material and a second polysilicon material, and a storage node coupled to the second source/drain region. Utilizing the combination of the first polysilicon material and a second polysilicon material, which are each subsequently etched after being deposited, provides a straighter etched profile, as compared to profiles etched from other materials (e.g., tungsten, titanium nitride, among other materials) and/or when a first polysilicon material or a second polysilicon material are utilized individually. Also, utilizing the combination of the first polysilicon material and a second polysilicon material provides that a relatively thinner masking material can be used, as compared to a thickness of masking materials used when other materials (e.g., tungsten, titanium nitride, among other materials) are utilized and/or when a first polysilicon material or a second polysilicon material are utilized individually.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 102 may reference element "02" in FIG. 1, and a similar element may be referenced as 202 in FIG. 2.

Figure 1:
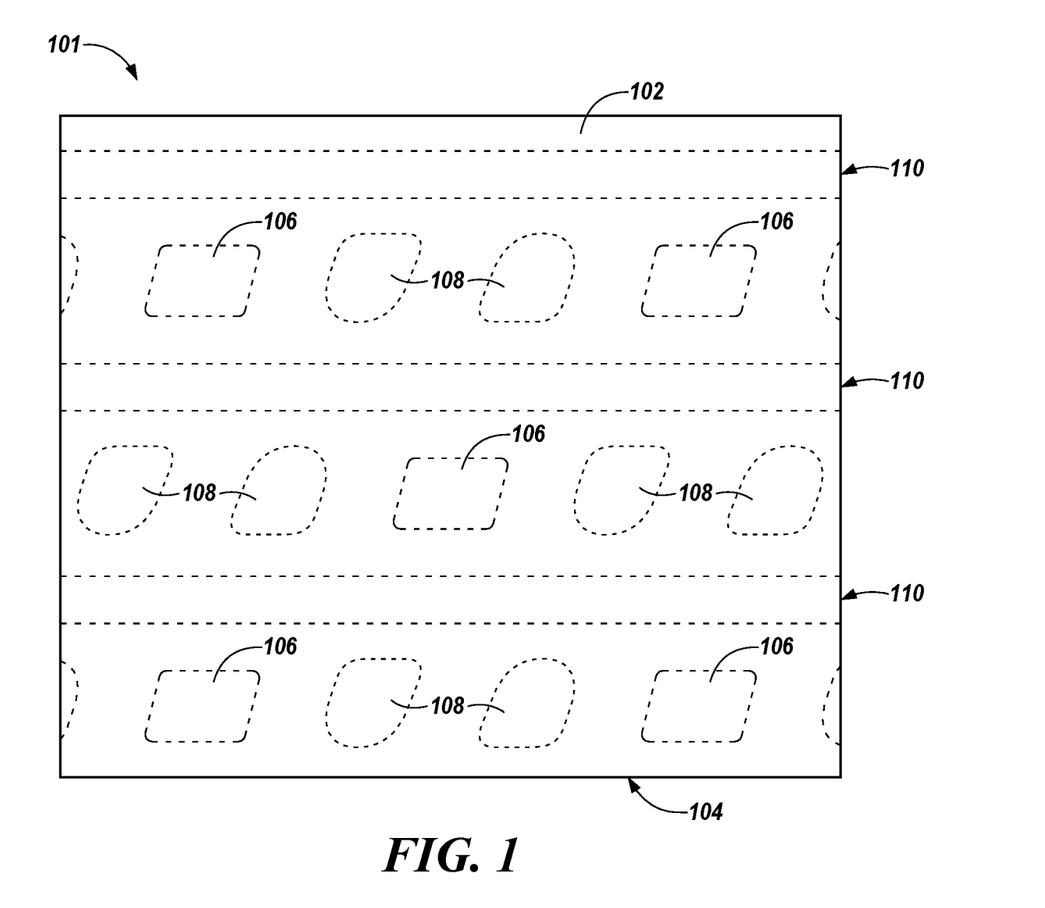
FIG. 1 illustrates a top-down view of a portion of an example semiconductor structure at a particular stage in an example semiconductor structure fabrication sequence in accordance with a number of embodiments of the present disclosure.

FIG. 1 illustrates a top-down view of a portion of an example semiconductor structure 101 at a particular stage in an example semiconductor structure fabrication sequence in accordance with a number of embodiments of the present disclosure. The semiconductor structure 101 illustrated in FIG. 1 is shown at a point in time that corresponds to various processing activities already having been performed in the example semiconductor structure fabrication sequence.

As shown in FIG. 1, a mask material 102 (also show as 202, 302, 402 in other Figures) may be formed over a substrate 104 (also show as 204, 304, 404 in other Figures) of the semiconductor structure 101. Semiconductor structures formed on and/or in the substrate 104 can include access devices, e.g., transistors, and storage nodes, e.g., capacitors, in an example memory array. A dynamic random access memory (DRAM) array is one form of an example memory array that can be formed from semiconductor structures fabricated through a semiconductor structure fabrication process, as discussed herein. The memory array may have an of array of access devices and storage nodes forming memory cells at the intersection of rows and columns. An access line (e.g., word line (WL)), may be used to activate an access device (e.g., a transistor), to access (e.g., turn "on" or "off" access to) the storage node of a memory cell. A sense line (e.g., bit line (BL) or digit line (DL)) may be used to read and/or program, e.g., write, refresh, erase, etc. to and/or from a storage node of the memory cells.

Access lines 110 (also show as 210, 310, 410 in other Figures), areas (e.g., active areas) for cell contacts 106 (also show as 206, 306, 406 in other Figures), and areas (e.g., active areas) for capacitor cell contacts 108 (also show as 208, 308, 408 in other Figures) may be formed on and/or in a substrate 104. The substrate 104 may be formed from various undoped or doped materials on which various other materials may be deposited, masked, etched, etc., to form semiconductor structures thereon. Examples of a relatively inert undoped substrate material may include monocrystalline silicon (monosilicon), polycrystalline silicon (polysilicon), and amorphous silicon, among other possibilities. A number of materials may be formed on the substrate 104 before and/or after the mask material 102 is formed.

Figure 2:
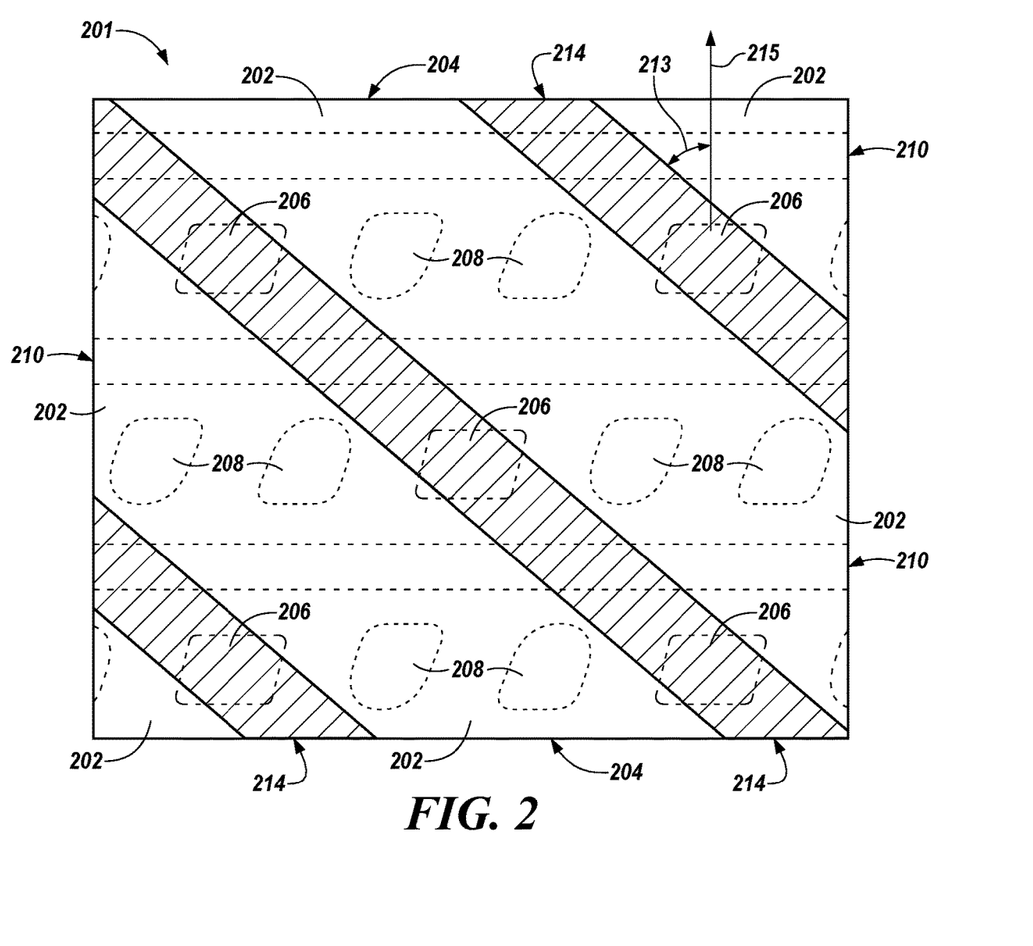
FIG. 2 illustrates a top-down view of a portion of an example semiconductor structure at a particular stage in an example semiconductor structure fabrication sequence in accordance with a number of embodiments of the present disclosure.

FIG. 2 illustrates a top-down view of a portion of an example semiconductor structure 201 at a particular stage in an example semiconductor structure fabrication sequence in accordance with a number of embodiments of the present disclosure. As shown in FIG. 2, the mask material 202 has been patterned.

Pattern 214 can be formed using a photolithographic technique, for instance. The mask material 202 can be patterned along a path connecting areas for cell contacts 206 in a direction different from an intended path (e.g., direction) for sense line formation (e.g., a sense line direction, illustrated by arrow 215). By patterning along a path connecting areas for cell contacts 206 in a direction different from intended sense line column formation, the mask material 202 can be patterned at an angle 213 to a sense line direction 215. As used here, the term sense line direction 215 refers to an orientation of the sense line (e.g., direction relative to other semiconductor structures) on the semiconductor die (e.g., on a wafer) upon which fabrication of semiconductor structures can be performed. For example, as illustrated in FIG. 2, the sense line direction 215 for orientation of sense line columns can be orthogonal to an orientation of access lines 210. The path creating the angle to the sense line direction may be formed along a path between an area for a cell contact in one sense line column and an area for a cell contact in a different sense line column. The columns may be adjacent to each other, for instance.

As semiconductor structure fabrication design rules have scaled to smaller dimensions, a margin for patterning to connect areas for cell contacts along a sense line direction (e.g., within a sense line column) may be more difficult without unintended and/or undesired patterning and etching over another area. For example, if the pattern 214 were formed in a direction along the intended sense line direction 215, the etching process to remove material to form cell contacts may impinge upon a portion of the active areas to capacitor cell contacts 208 due to a reduced design rule margin, for instance. According to one or more embodiments, as shown in FIG. 2, the cell contact mask pattern path 214, formed at an angle to the intended sense line direction 215, does not pattern the portion of the mask material 202 over the active areas of the capacitor cell contacts 208. Therefore, in a subsequent etch process to form cell contacts to the active areas for cell contacts 206 will not be impinged during an etch process.

Figure 3:
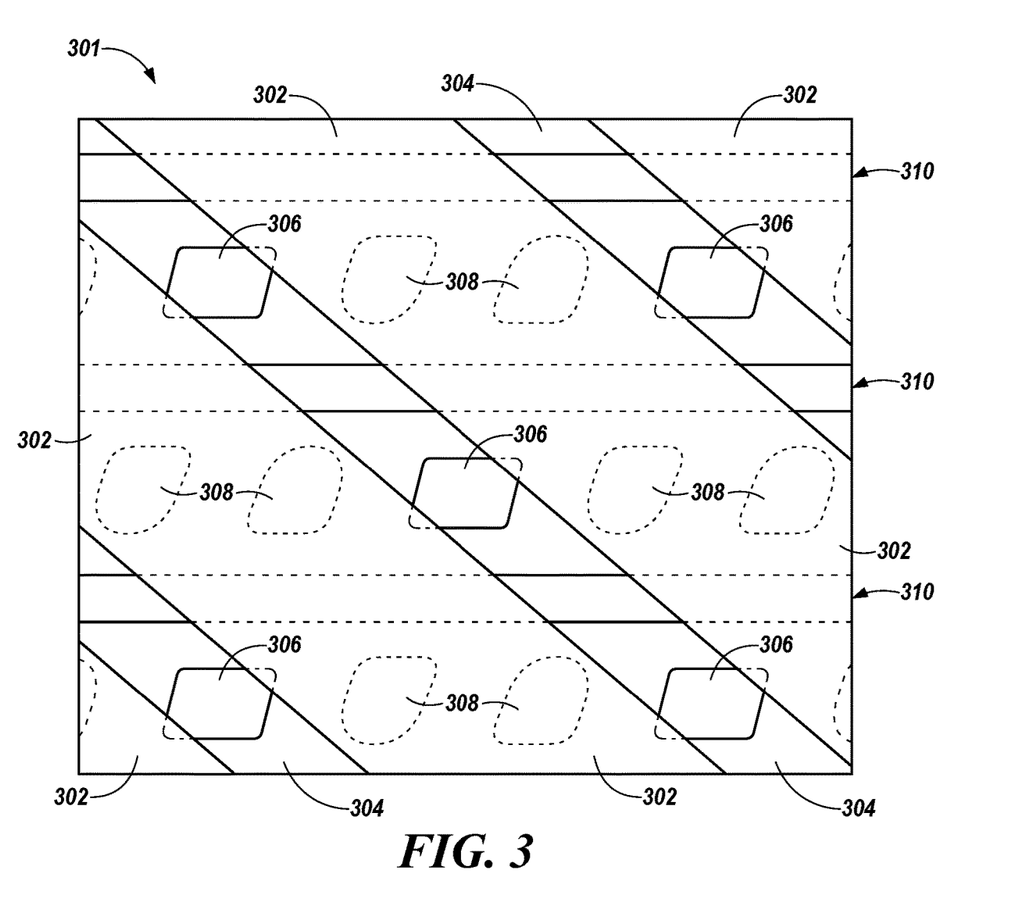
FIG. 3 illustrates a top-down view of a portion of an example semiconductor structure at a particular stage in an example semiconductor structure fabrication sequence in accordance with a number of embodiments of the present disclosure.

FIG. 3 illustrates a top-down view of a portion of an example semiconductor structure 301 at a particular stage in an example semiconductor structure fabrication sequence in accordance with a number of embodiments of the present disclosure. The fabrication sequence illustrated in FIG. 3 is shown at a point in time that corresponds to various processing activities already having been performed in the fabrication sequence.

FIG. 3 illustrates that the mask material 302 has been etched and an opening has been formed in the semiconductor structure. Embodiments provide that a number of materials that have previously been formed beneath the mask material 302 may also be etched to form the opening in the semiconductor structure. Various etching processes may be utilized. Etching is a process to remove (e.g., chemically) different materials selectively and/or non-selectively from among different portions of semiconductor structures during the fabrication process. Two types of etchants are liquid-phase (wet) and plasma-phase (dry). Wet etching uses etchants in liquid form. During a wet etch, a semiconductor structure can be immersed in a bath of the etchant, which can be agitated to achieve good process control. As an example, buffered hydrofluoric acid (BHF) can be used to etch silicon dioxide. As an alternative to immersion, certain semiconductor structure fabrication tools and equipment (e.g., a semiconductor structure processing chamber) may employ a gas to cushion and protect one side of the wafer while an etchant is applied to the other side.

Plasma etching tools and equipment can operate in several modes by adjusting parameters of a plasma gas applied to a semiconductor structure undergoing a fabrication process. The plasma can produce energetic free radicals, neutrally charged, that react at a surface of the semiconductor structure. A source gas for the plasma can contain small molecules rich in chlorine or fluorine.

The pattern may be etched to remove a portion of the mask material 302, and a number of materials that have previously been formed beneath the mask material and form an opening to areas for cell contacts 306. After etching the portion of the mask material 302 to from the areas for the cell contacts 306, a portion of the mask material 302 may remain over a portion of the areas for the cell contacts 306. A second etch may be used to remove this remaining portion of the mask material 302 from over the areas for the cell contacts 306. For some embodiments, a portion of the mask material 302 over the areas for the capacitor cell contacts 308 may protect the capacitor cells during this process (e.g., may not be patterned and etched).

Figure 4:
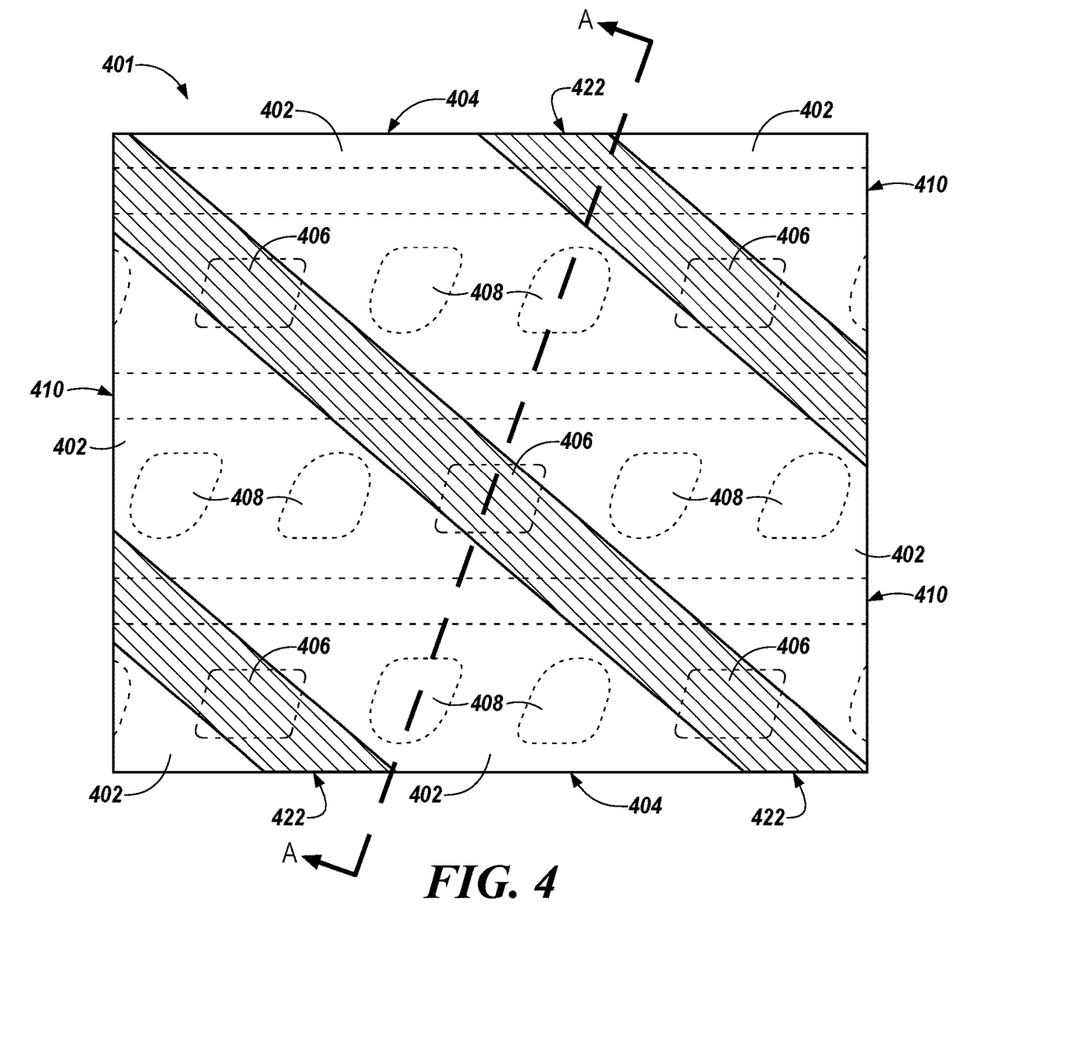
FIG. 4 illustrates a top-down view of a portion of an example semiconductor structure at a particular stage in an example semiconductor structure fabrication sequence in accordance with a number of embodiments of the present disclosure.

FIG. 4 illustrates a top-down view of a portion of an example semiconductor structure 401 at a particular stage in an example semiconductor structure fabrication sequence in accordance with a number of embodiments of the present disclosure. The fabrication sequence illustrated in FIG. 4 is shown at a point in time that corresponds to various processing activities already having been performed in the fabrication sequence. As shown in FIG. 4, the memory cells can have an 8F2 cell size, where "F" is a feature size corresponding to the cells. However, embodiments are not so limited. For instance, a 4F2 or 6F2 cell size may be utilized.

FIG. 4 illustrates that the openings formed by etching a portion of the mask material 402 (and a number of materials that have previously been formed beneath the mask material) have been filled in using a conductive fill 422. The conductive fill 422 can include a combination of a first polysilicon material and a second polysilicon material, as discussed further herein. The first polysilicon material can be deposited in the opening formed by etching a portion of the mask material 402 (and a number of materials that have previously been formed beneath the mask material) and the second polysilicon material can be deposited in the opening on the first polysilicon material.

Figure 5A:
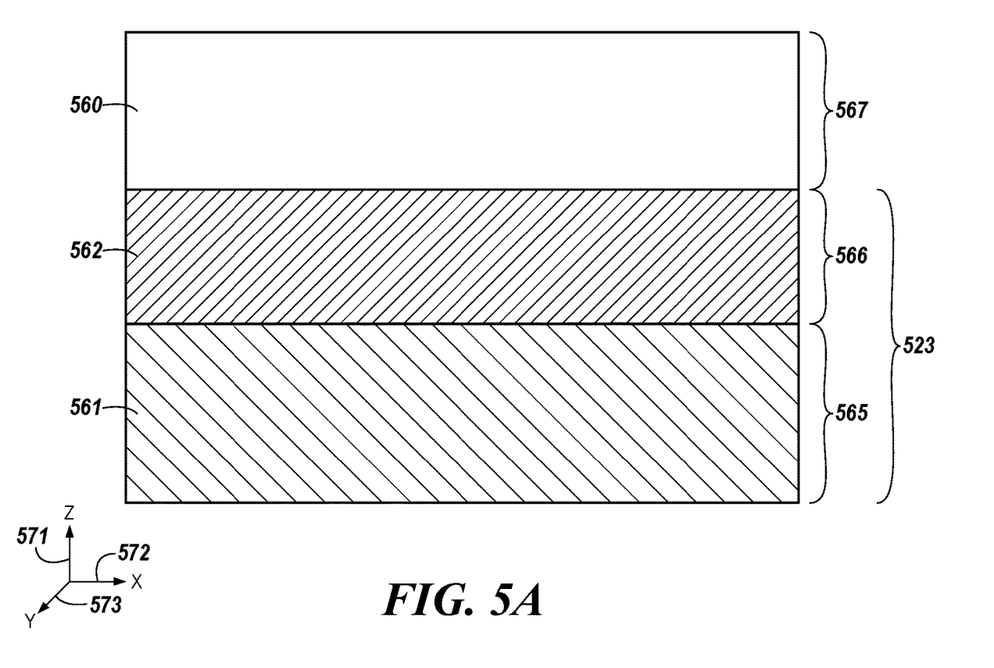
FIGS. 5A-5H illustrate views of a portion of an example semiconductor structure at a particular stages in an example semiconductor structure fabrication sequence in accordance with a number of embodiments of the present disclosure.

FIG. 5A illustrates a view of a portion of an example semiconductor structure at a particular stage in an example semiconductor structure fabrication sequence in accordance with a number of embodiments of the present disclosure. FIG. 5A illustrates a view along cutline AA shown in FIG. 4, with the addition of a mask material 560 thereto. In other words, after the first polysilicon material and the second polysilicon material are formed, the mask material can be formed (e.g., deposited) thereon.

The mask material 560 may be a nitride material, for example. An example of a nitride material includes, but is not limited to, silicon nitride ($SiN_x$, $Si_3N_4$).

As shown in FIG. 5A, the conductive fill 523 can include a first polysilicon material 561 and a second polysilicon material 562. The mask material 560 can be formed subsequently to the first polysilicon material 561 and the second polysilicon material 562. The mask material 560 can be separated from the first polysilicon material 561 by the second polysilicon material 562 (e.g., the second polysilicon material 562 can be formed between the first polysilicon material 561 and the mask material 560). The first polysilicon material 561, a second polysilicon material 562, and the mask material 560 can be formed with one or more semiconductor structure fabrication processes, such as chemical vapor deposition, for instance.

The first polysilicon material 561 can be doped. The first polysilicon material 561 can include a p-type dopant or an n-type dopant. By way of example, and not by way of limitation, the n-type dopant may include phosphorous (P) and the p-type dopant may include boron (B). Embodiments, however, are not limited to these examples. Embodiments provide that the first polysilicon material 561 can include a low (e.g., less than) dopant concentration as compared to the second polysilicon material 562.

The second polysilicon material 562 can be doped. The second polysilicon material 562 can include a p-type dopant or an n-type dopant. Embodiments provide that the second polysilicon material 562 can include a high (e.g., greater than) dopant concentration as compared to the first polysilicon material 561.

One or more embodiments provide that the first polysilicon material 561 and the second polysilicon material 562 can both be doped with a same dopant (e.g., both can be doped with boron). One or more embodiments provide that the first polysilicon material 561 and the second polysilicon material 562 can be doped with dopants.

The first polysilicon material 561 can be formed to have a thickness 565 from 200 to 450 angstroms. All individual values and subranges from 200 to 450 angstroms are included; for example, first polysilicon material can have a thickness from a lower limit of 200, 225, or 250 angstroms to an upper limit of 450, 400, or 350 angstroms. The thickness 565 extends in a vertical ("Z") direction 571, e.g., perpendicular to a first horizontal ("X") direction 572 and a second horizontal ("Y") direction 573 plane. The vertical ("Z") direction 571 may extend (e.g., vertically) from a surface of the substrate discussed herein.

The second polysilicon material 562 can be formed to have a thickness 566 from 200 to 450 angstroms. All individual values and subranges from 200 to 450 angstroms are included; for example, second polysilicon material can have a thickness from a lower limit of 200, 225, or 250 angstroms to an upper limit of 450, 400, or 350 angstroms. The thickness 566 extends in the vertical ("Z") direction 571.

The mask material 560 can be formed to have a thickness 567 from 200 to 450 angstroms. All individual values and subranges from 200 to 450 angstroms are included; for example, mask material can have a thickness from a lower limit of 200, 225, or 250 angstroms to an upper limit of 450, 400, or 350 angstroms. The thickness 567 extends in the vertical ("Z") direction 571. One or more embodiments provide that the thickness 567 is relatively thinner than other mask materials used when other materials (e.g., tungsten, titanium nitride, among other materials).

Figure 5B:
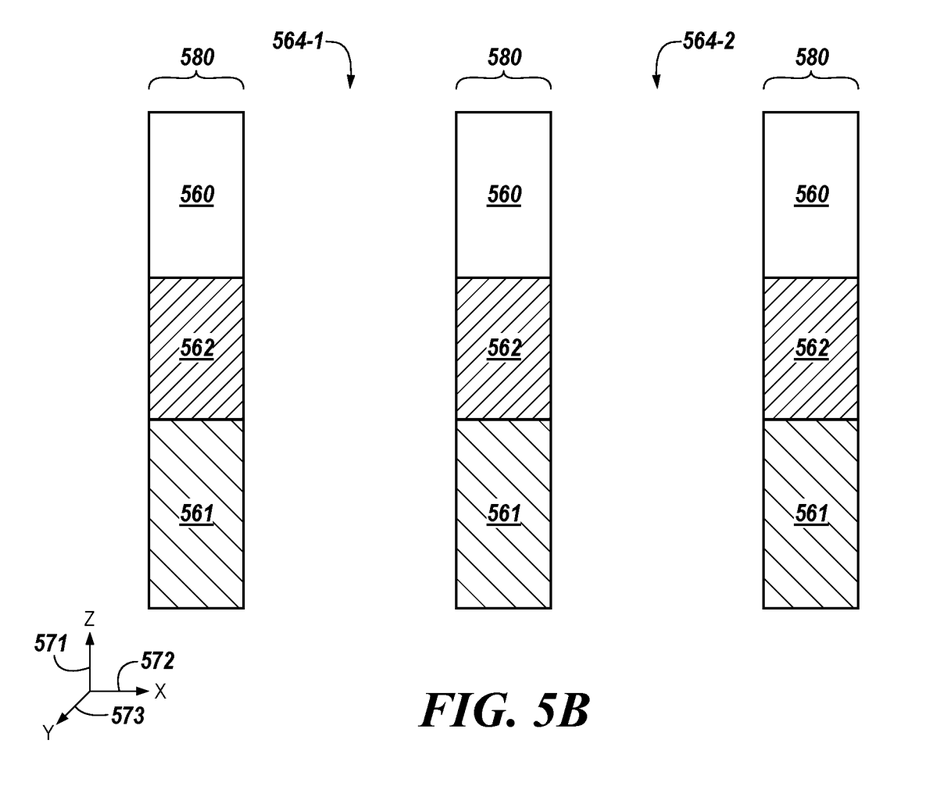

FIG. 5B illustrates a view of a portion of an example semiconductor structure at a particular stage in an example semiconductor structure fabrication sequence in accordance with a number of embodiments of the present disclosure. As shown in FIG. 5B, a trench 564 (e.g., an opening) can be formed in the mask material 560, the second polysilicon material 562, and the first polysilicon material 561. One or more embodiments provide that the trenches 564-1, 564-2 may extend to a source/drain region, as discussed further herein. While two trenches 564-1, 564-2 are shown in FIG. 3, embodiments are not so limited. The trench 564 can be formed by one or more semiconductor structure fabrication processes (e.g., etches, such as selective etches). One or more embodiments provide that the trenches 564 are formed so that etched materials (e.g., first polysilicon material 561, a second polysilicon material 562, and the mask material 560) have a width 580 from 50 to 90 angstroms. The width 580 extends in a horizontal direction (e.g., the horizontal ("X") direction 572) that is perpendicular to the vertical ("Z") direction 571.

The trench 564 can be formed in the mask material 560, the second polysilicon material 562, and the first polysilicon material 561. By a number of semiconductor structure fabrication processes. For instance, the mask material 560 can be etched by a dry etching process and the second polysilicon material 562, and the first polysilicon material 561 can be etched by one or more wet etching processes.

Figure 5C:
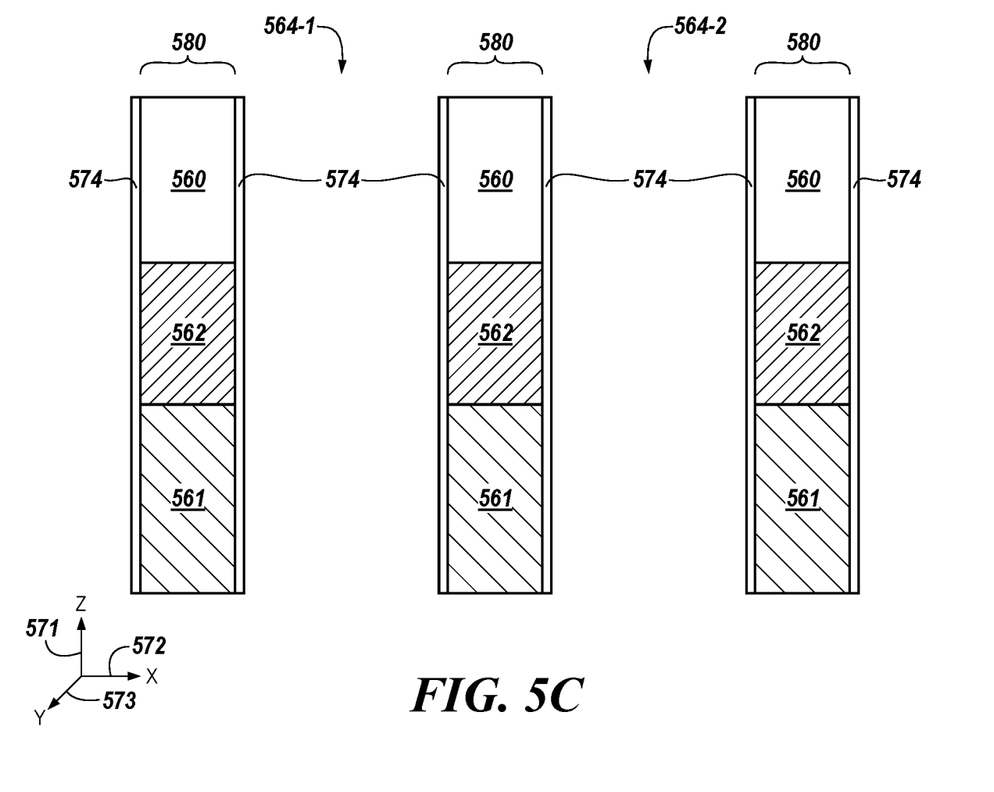

FIG. 5C illustrates a view of a portion of an example semiconductor structure at a particular stage in an example semiconductor structure fabrication sequence in accordance with a number of embodiments of the present disclosure. As shown in FIG. 5C, a spacer material 574 (e.g., a dielectric material) can be deposited in the trench 564-1, 564-2. The spacer material 574 can be deposited on sidewalls of the first polysilicon material 561, the second polysilicon material 562, and the mask material 560. One or more embodiments provide that the spacer material 574 can be conformally deposited. As used herein, the term "dielectric material" refers to and includes electrically insulative materials. Dielectric materials, as discussed herein, may include, but is not limited to, one or more of an insulative oxide material or an insulative nitride material. A dielectric oxide may be an oxide material, a metal oxide material, or a combination thereof. The dielectric oxide may include, but is not limited to, a silicon oxide ($SiO_x$), doped $SiO_x$, phosphosilicate glass, borosilicate glass, borophosphosilicate glass, fluorosilicate glass, tetraethylorthosilicate (TEOS), aluminum oxide ($AlO_x$), gadolinium oxide (GdOx), hafnium oxide (HfOx), magnesium oxide (MgOx), niobium oxide (NbOx), tantalum oxide (TaOx), titanium oxide (TiOx), zirconium oxide carboxynitride material (e.g., SiOxCzNy), a combination thereof or a combination of one or more of the listed materials with silicon oxide.

Figure 5D:
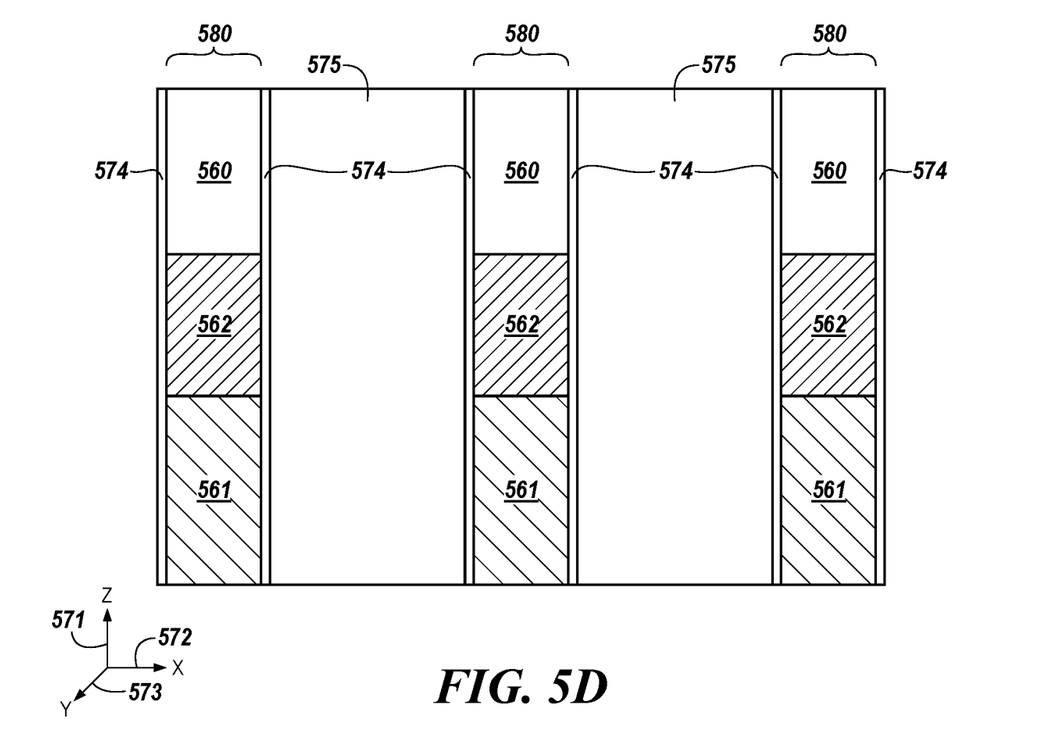

FIG. 5D illustrates a view of a portion of an example semiconductor structure at a particular stage in an example semiconductor structure fabrication sequence in accordance with a number of embodiments of the present disclosure. As shown in FIG. 5D, a dielectric material 575 can be deposited in the trench 564-1, 564-2. The dielectric material 575 can be formed on the spacer material 574 and can be utilized to fill the trenches 564-1, 564-2. The dielectric material 575 can be referred to as an interlayer dielectric (ILD).

Figure 5E:
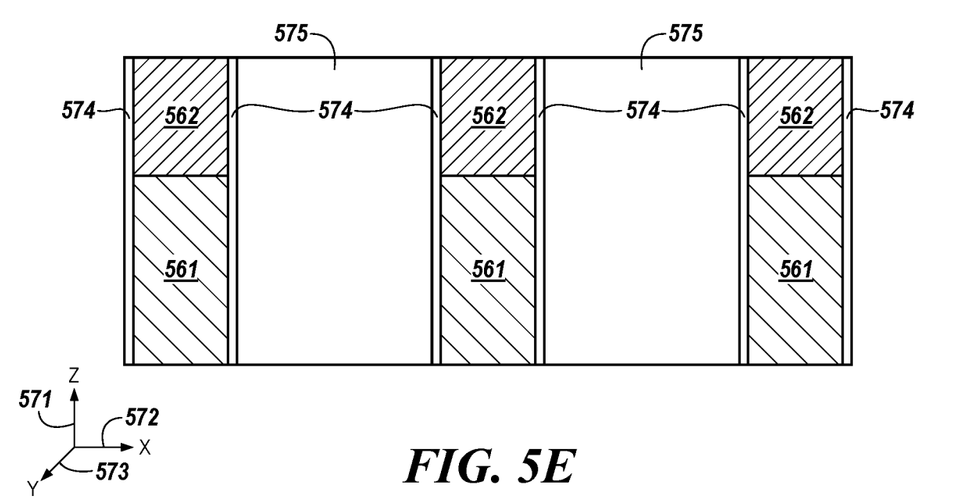

FIG. 5E illustrates a view of a portion of an example semiconductor structure at a particular stage in an example semiconductor structure fabrication sequence in accordance with a number of embodiments of the present disclosure. As shown in FIG. 5E, a planarization (e.g., chemical mechanical planarization (CMP)) can be utilized to expose a portion of the second polysilicon material 562. The planarization can be utilized to remove the mask material 560, a portion of the spacer material 574, and a portion of the dielectric material 575.

Figure 5F:
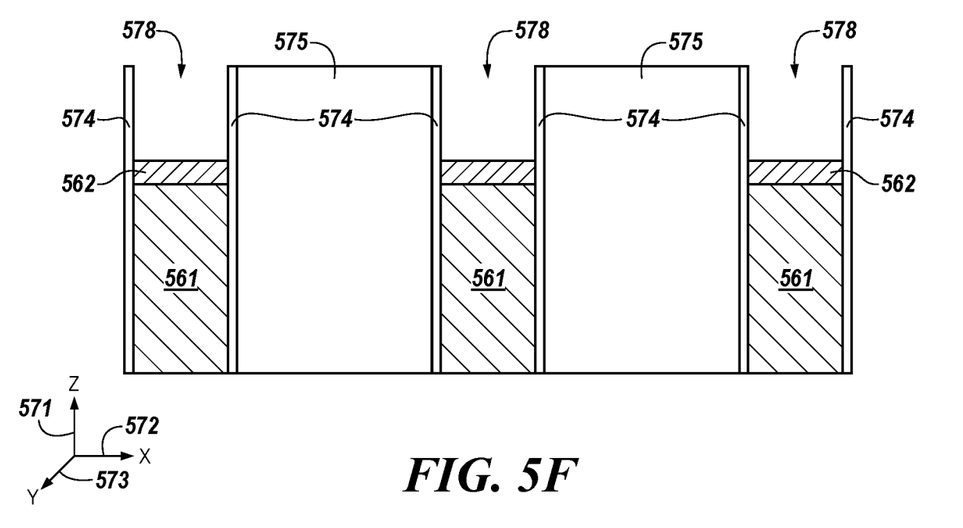

FIG. 5F illustrates a view of a portion of an example semiconductor structure at a particular stage in an example semiconductor structure fabrication sequence in accordance with a number of embodiments of the present disclosure. As shown in FIG. 5F, a portion of the second polysilicon material 562 can be removed to make a sense line material deposition space 578. The portion of the second polysilicon material 562 can be removed by an etch process (e.g., selective etching). One or more embodiments provide that the sense line material deposition space 578 can have an aspect ratio of about 4.

Figure 5G:
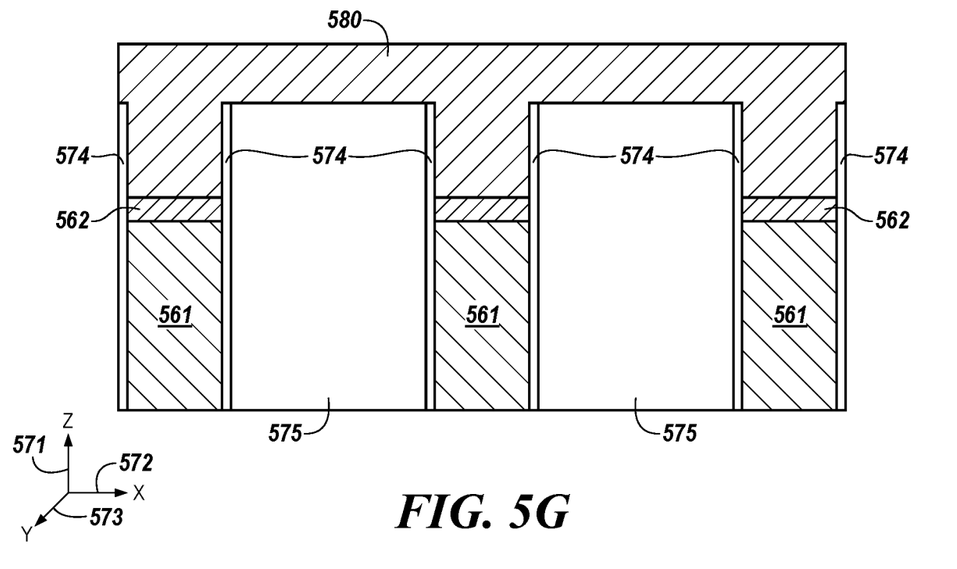

FIG. 5G illustrates a view of a portion of an example semiconductor structure at a particular stage in an example semiconductor structure fabrication sequence in accordance with a number of embodiments of the present disclosure. As shown in FIG. 5G, a sense line material 580 can be deposited in the sense line material deposition space (e.g., to make a sense line).

Embodiments provide that the sense line material 580 can be a conductive material. The sense line material 580 can include a metal (e.g., tungsten (W), titanium (Ti), tantalum (Ta), ruthenium (Ru), cobalt (Co), molybdenum (Mo), etc.), a conductive metal nitride (e.g., titanium nitride, tantalum nitride, etc.), and/or a metal-semiconductor compound (e.g., tungsten silicide, cobalt silicide, titanium silicide, etc.), among other materials. One or more embodiments provide that the sense line material 580 comprises ruthenium.

Figure 5H:
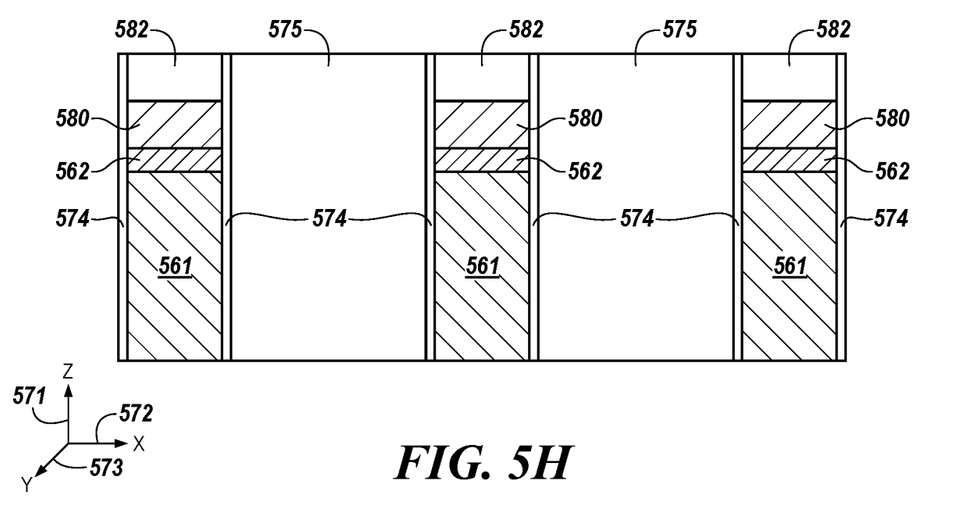

FIG. 5H illustrates a view of a portion of an example semiconductor structure at a particular stage in an example semiconductor structure fabrication sequence in accordance with a number of embodiments of the present disclosure. As shown in FIG. 5H, the sense line material 580 can be recessed and a cap material 582 can be deposited thereon. Examples of the cap material include boron nitride (BN), silicon nitride ($SiN_x$, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), for instance. One or more embodiments provide that the cap material comprises silicon nitride.

While FIG. 5H illustrates the second polysilicon material 562 and the first polysilicon material 561 as two distinct materials, embodiments are not so limited. One or more embodiments provide that at least a portion of dopant of the second polysilicon material 562 can diffuse into the first polysilicon material 561 (e.g., such that the second polysilicon material 562 dopant diffused into the first polysilicon material 561 can be considered a single, uniformly doped material). Diffusion, as used herein, refers to a process where a dopant from one area spreads into another area (e.g., dopant from the relatively higher doped second polysilicon material 562 spreads to the relatively lower doped first polysilicon material 561).

While not shown in FIGS. 5A-5H, embodiments provide that a number of further semiconductor structure fabrication process steps may be performed (e.g., after depositing the sense line material 580). For instance, a photolithographic technique may be used to pattern a photolithographic mask on the semiconductor structure prior to etching one or materials, such as the dielectric material 575 (e.g., in preparation for to perform a fill process on the semiconductor structure). One or more embodiments provide that the dielectric material 575 can be removed (e.g., with selective etching) in preparation for a photolithographic technique that may be used to pattern a photolithographic mask on the semiconductor structure prior to etching one or materials (e.g., the sense line material 580), which may be followed by a fill process (e.g., spin on dielectric).

Figure 6:
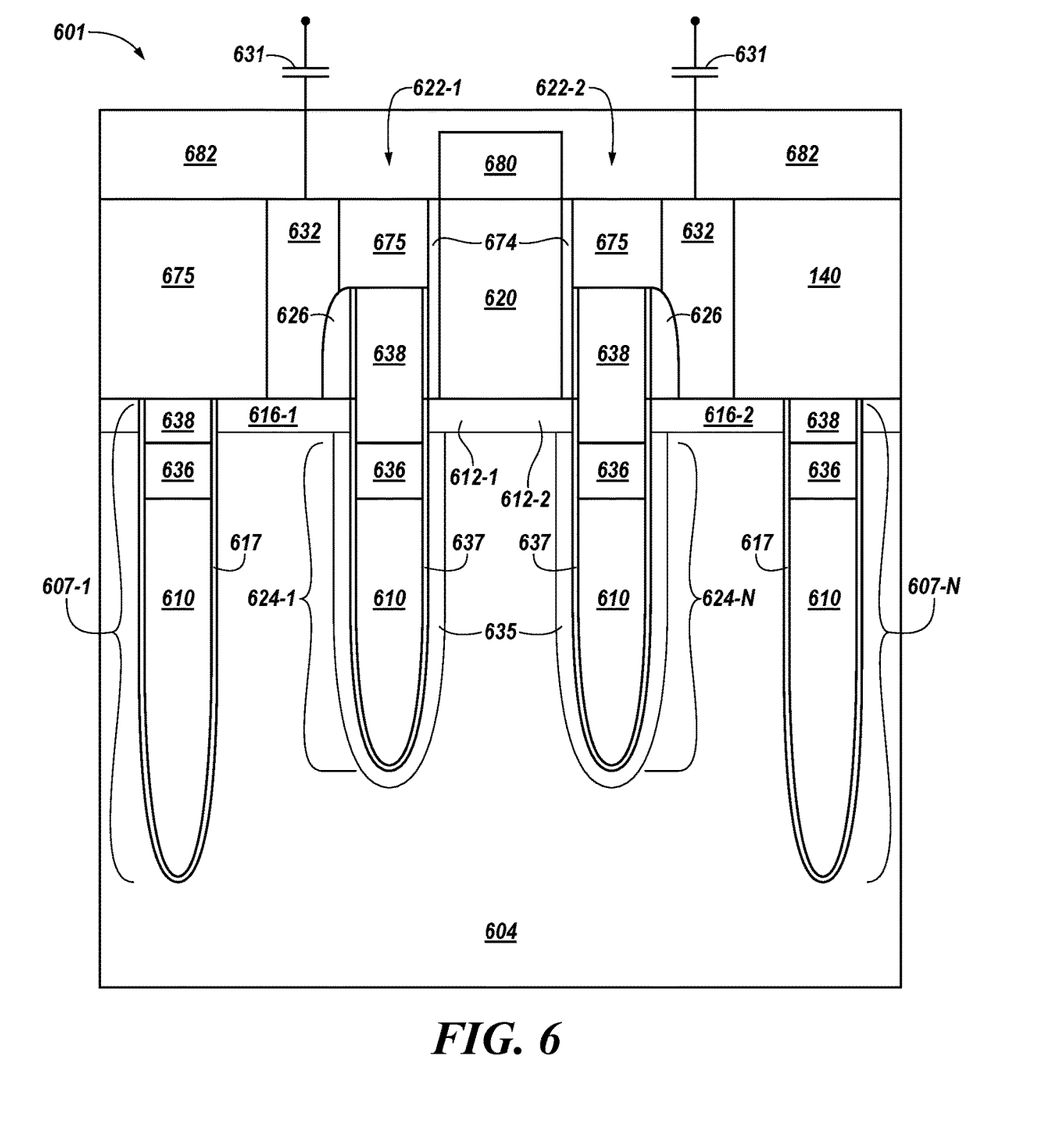
FIG. 6 shows a view of a portion of an example semiconductor structure in accordance with a number of embodiments of the present disclosure.

FIG. 6 shows a view of a portion of an example semiconductor structure in accordance with a number of embodiments of the present disclosure. The semiconductor structure 601 illustrated in FIG. 6 is shown at a point in time that corresponds to various processing activities already having been performed in the example semiconductor structure fabrication sequence. The semiconductor structure 601 illustrated in FIG. 6 may be utilized as a memory device.

FIG. 6 illustrates an example cross-sectional view of a portion of a semiconductor structure 601 including a sense line (e.g., sense line material 680) and cell contact 620. The cell contact 620 is formed from the second polysilicon material and the first polysilicon material, as previously discussed. FIG. 6 illustrates the cell contact 620 as a single material (e.g., the second polysilicon material has diffused into the first polysilicon material). FIG. 6 also illustrates the spacer material 674, cap material 682, and the dielectric material 675, as previously discussed.

FIG. 6 illustrates neighboring access devices 622-1, 622-2 (e.g., memory cell transistor) as may be present in a memory array of a memory device. In the example embodiment of FIG. 6, the neighboring access devices 622-1, 622-2 are shown as buried recessed access devices (BRADs), which may be part of a dynamic random access memory (DRAM) array. Embodiments, however, are not limited to this example.

Isolation trenches 607-1, . . . , 607-N may be used to separate neighboring access devices from other access devices according to a particular array layout. FIG. 6 illustrates a pair of isolation trenches 607 in one such architecture in accordance with an embodiment of the present disclosure. In semiconductor device 601, an isolation trench 607 may be used to prevent electric current leakage between adjacent semiconductor device components, for instance. Isolation trench 607 may be formed by etching a pattern of the isolation trench 607 into a substrate material 604 and depositing a dielectric material 617 into the trench 607. In a semiconductor structure fabrication process, other trenches may be formed and a gate dielectric 637 and semiconductor materials may be deposited to form access device gate 610 and 636 (collectively or individually referred to as gate 610) according to a particular BRAD design process. Gate 610 may also be referred to as a passing access line. Embodiments are not limited to the example shown. In this example of neighboring BRAD devices 622-1, 622-2, isolation trench 607 may be formed to a greater depth than a depth of a gate area 624-1, . . . , 624-N of the BRAD devices 622-1, 622-2.

In one embodiment, a first dielectric 617 may be deposited into the isolation trench 607. The first dielectric 617 may be deposited to a thickness in a range of 1-5 nanometers (nm), as an example. The first dielectric 617 can be a barrier between the substrate material 604 and the other neighboring semiconductor devices and/or components, for instance.

A passing access line 610 (e.g., word line) may also be deposited into the isolation trench 607. In some embodiments, passing access line 610 may be a metal, among other materials.

The depth of the isolation trench 607 may be deeper than the depth of a gate area 624-1, . . . , 624-N used to form an active area of the access line (e.g., a word line (gate)) 610 and 636. For a number of embodiments, the isolation trench 607 may have a depth in the range of 200-250 nm, for instance.

As shown in FIG. 6, the gates 610 are also formed for the access devices 622-1, 622-2. As shown, the gate 610 may be a gate to a recessed access device (e.g., a BRAD). In the example shown, the gate 610 may include a metal (e.g., titanium nitride (TiN)), among other materials. The gate 610 may be separated from a channel 635, separating a first source/drain region 616-1 and 616-2 (collectively or individually referred to as first source/drain region 616) and a second source/drain region 612-1 and 612-2 (collectively or individually referred to as second source/drain region 612) by gate dielectric 637. The gate dielectric 637 may include, for example, a silicon oxide material, a silicon nitride material, a silicon oxynitride material, etc., or a combination thereof. Embodiments are not so limited. For example, in high-k dielectric material examples the gate dielectric material 637 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

In the example of FIG. 6, two neighboring access devices 622-1, 622-2 are shown sharing a second source/drain region 612 at a junction. The cell contact 620 may be formed as discussed with FIGS. 5A-5H. The cell contact 620 may be formed in contact with the second source/drain region 612, and the junction, as an example. A sense line 680 (e.g., digit line or bit line) may be formed in contact with the cell contact 620. A storage node contact 632 may be coupled to each first source/drain region 616, and a storage node 631 may be coupled to the storage node contact 632. An insulation material 675 (e.g., a dielectric material) may be formed on spacer material and mask material 626 and 638 (e.g., to separate conductive contacts 632).

In one or more embodiments, a portion of the cell contact 620 may be formed in contact with a spacer material 626, the second source/drain regions 612, and the junction. Insulation material 675 may be formed on the spacer material 626, the mask material 638, and in contact with a portion of the cell contact 620 and storage node contacts 632, for instance. A gate dielectric 637 can separate the gate 610 from the channel 635 for each of the neighboring BRAD devices 622-1, 622-1 shown in the example of FIG. 6.

Figure 7:
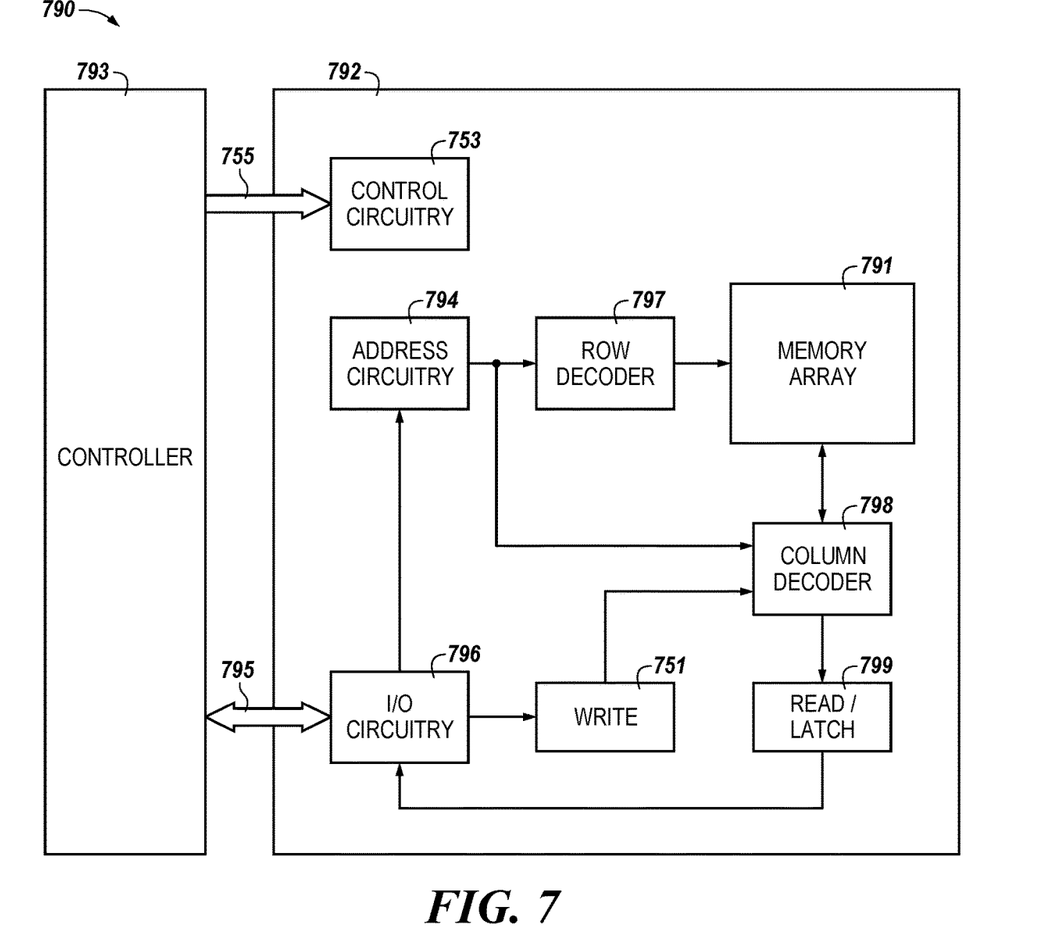
FIG. 7 is a block diagram illustration of an example apparatus, such as an electronic memory system, in accordance with an embodiment of the present disclosure.

FIG. 7 is a block diagram illustration of an example apparatus, such as an electronic memory system 790, in accordance with an embodiment of the present disclosure. Memory system 790 may include an apparatus, such as a memory device 792 and a controller 793, such as a memory controller (e.g., a host controller). Controller 793 might include a processor, for example. Controller 793 might be coupled to a host, for example, and may receive command signals (or commands), address signals (or addresses), and data signals (or data) from the host and may output data to the host. Controller 793 can perform one or more operations for storing one data value by programming a first memory cell and a second memory cell, in accordance with the present disclosure.

Memory device 792 includes a memory array 791 of memory cells. For example, memory array 791 may include one or more of the memory arrays, such as a vertical pillar array, of memory cells discussed herein. Memory device 792 may include address circuitry 794 to latch address signals provided over I/O connections 795 through I/O circuitry 796. Address signals may be received and decoded by a row decoder 797 and a column decoder 798 to access the memory array 700.

Memory device 792 may sense (e.g., read) data in memory array 791 by sensing voltage and/or current changes in the memory array columns using sense/buffer circuitry that in some examples may be read/latch circuitry 799. Read/latch circuitry 799 may read and latch data from the memory array 791. Sensing circuitry (not shown) may include a number of sense amplifiers coupled to memory cells of memory array 791, which may operate in combination with the read/latch circuitry 799 to sense (e.g., read) memory states from targeted memory cells. I/O circuitry 796 may be included for bi-directional data communication over the I/O connections 795 with controller 793. Write circuitry 751 may be included to write data to memory array 791.

Control circuitry 753 may decode signals provided by control connections 755 from controller 793. These signals may include chip signals, write enable signals, and address latch signals that are used to control the operations on memory array 791, including data read and data write operations.

Control circuitry 753 may be included in controller 793, for example. Controller 793 may include other circuitry, firmware, software, or the like, whether alone or in combination. Controller 793 may be an external controller (e.g., in a separate die from the memory array 791, whether wholly or in part) or an internal controller (e.g., included in a same die as the memory array 791). For example, an internal controller might be a state machine or a memory sequencer.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

While example examples including various combinations and configurations of semiconductor materials, underlying materials, structural materials, dielectric materials, capacitor materials, working surface materials, silicate materials, nitride materials, buffer materials, etch chemistries, etch processes, solvents, memory devices, memory cells, sidewalls of openings and/or trenches, among other materials and/or components related to stacking a semiconductor structure have been illustrated and described herein, examples of the present disclosure are not limited to those combinations explicitly recited herein. Other combinations and configurations of the semiconductor materials, underlying materials, structural materials, dielectric materials, capacitor materials, substrate materials, working surfaces, silicate materials, nitride materials, buffer materials, etch chemistries, etch processes, solvents, memory devices, memory cells, sidewalls of openings and/or trenches related to stacking a semiconductor structure than those disclosed herein are expressly included within the scope of this disclosure.

What is claimed is:

1. An apparatus, comprising:
   a first source/drain region and a second source/drain region, wherein the first source/drain region and the second source/drain region are separated by a channel;
   a gate opposing the channel;
   a sense line coupled to the first source/drain region by a cell contact, wherein the cell contact is made from a combination of a first polysilicon material and a second polysilicon material, wherein the second polysilicon material that is deposited to make the cell contact has a greater dopant concentration than the first polysilicon material; and
   a storage node coupled to the second source/drain region.

2. The apparatus of claim 1, wherein a portion of the second polysilicon material that is deposited to make the cell contact is selectively removed prior to depositing a sense line material.

3. The apparatus of claim 2, wherein the sense line material has a width from 60 to 80 angstroms.

4. The apparatus of claim 3, wherein the sense line material has a height from 250 to 300 angstroms.

5. The apparatus of claim 2, wherein the sense line material comprises ruthenium.

6. The apparatus of claim 1, wherein the apparatus is a buried recessed access device (BRAD).

7. A method, comprising:
   forming an opening in a semiconductor structure;
   depositing a first polysilicon material in the opening;
   depositing a second polysilicon material in the opening on the first polysilicon material, wherein the second polysilicon material has a greater dopant concentration than the first polysilicon material to form a cell contact made from the first polysilicon material and the second polysilicon material wherein the cell contact is formed on a source/drain region;
   depositing a mask material on the second polysilicon material;
   forming a trench in the mask material, the second polysilicon material, and the first polysilicon material;
   depositing a dielectric material in the trench;
   removing a portion of the second polysilicon material to make a sense line material deposition space; and
   depositing a sense line material in the sense line material deposition space, wherein the sense line material is formed on the cell contact.

8. The method of claim 7, further comprising conformally depositing a spacer material in the trench prior to depositing the dielectric material in the trench.

9. The method of claim 8, further comprising planarizing the spacer material, the mask material, and the dielectric material prior to removing a portion of the second polysilicon material.

10. The method of claim 7, further comprising planarizing the sense line material.

11. The method of claim 10, further comprising forming a cap material on the planarized sense line material.

12. The method of claim 11, wherein the cap material is a nitride material.

13. The method of claim 7, wherein the sense line material deposition space has an aspect ratio of about 4.

14. The method of claim 7, wherein the first polysilicon material is deposited to a thickness 200 to 450 angstroms.

15. The method of claim 9, wherein the second polysilicon material is deposited to a thickness 200 to 450 angstroms.

16. An apparatus, comprising:
    a cell contact made from a first polysilicon material and a second first polysilicon material that is formed on the first polysilicon material, wherein the second polysilicon material has a greater dopant concentration than the first polysilicon material;
    a source/drain region, wherein the cell contact is formed on the source/drain region; and
    a sense line material, wherein the sense line material is formed on the cell contact.

17. The apparatus of claim 16, further comprising a capacitor coupled to the sense line.

18. The apparatus of claim 16, wherein the apparatus is s a buried recessed access device (BRAD) that is part of a dynamic random access memory (DRAM) array.

19. An apparatus, comprising:
    a first source/drain region and a second source/drain region, wherein the first source/drain region and the second source/drain region are separated by a channel;
    a gate opposing the channel;
    a sense line coupled to the first source/drain region by a cell contact, wherein the cell contact is made from a combination of a first polysilicon material and a second polysilicon material that is different than the first polysilicon material, wherein at least a portion of dopant of the second polysilicon material is diffused into the first polysilicon material to make a uniformly doped material; and
    a storage node coupled to the second source/drain region.

* * * * *